US008085551B2

(12) United States Patent
Karasawa et al.

(10) Patent No.: US 8,085,551 B2
(45) Date of Patent: Dec. 27, 2011

(54) ELECTRONIC COMPONENT AND MANUFACTURING THE SAME

(75) Inventors: Seiji Karasawa, Nagano (JP); Koji Fujimoto, Nagano (JP)

(73) Assignee: KOA Corporation (JP)

( * ) Notice: Subject to any disclaimer, the term of this patent is extended or adjusted under 35 U.S.C. 154(b) by 953 days.

(21) Appl. No.: 12/050,814

(22) Filed: Mar. 18, 2008

(65) Prior Publication Data

US 2008/0232075 A1 Sep. 25, 2008

(30) Foreign Application Priority Data

Mar. 19, 2007 (JP) ................................ 2007-070672

(51) Int. Cl.
*H05K 7/00* (2006.01)
*H05K 3/30* (2006.01)

(52) U.S. Cl. ........ 361/782; 361/760; 361/761; 338/204; 338/205; 338/254; 338/255; 338/258; 338/327; 338/328; 174/260; 29/610.1; 29/619; 29/620; 29/621; 29/832

(58) Field of Classification Search .................. 361/760, 361/761, 782; 338/204, 205, 254, 255, 258, 338/327, 328; 174/250–268; 29/610.1, 611–621, 29/832

See application file for complete search history.

(56) References Cited

U.S. PATENT DOCUMENTS 4,792,781 A * 12/1988 Takahashi et al. ............ 338/307
5,680,092 A * 10/1997 Yamada et al. ............... 338/309
5,907,274 A * 5/1999 Kimura et al. ................ 338/309
5,914,649 A * 6/1999 Isono et al. .................. 337/290
6,314,637 B1 * 11/2001 Kimura et al. .................. 29/620
6,356,184 B1 * 3/2002 Doi et al. ...................... 338/309
6,492,896 B2 * 12/2002 Yoneda ......................... 338/309
6,861,941 B2 * 3/2005 Kuriyama ..................... 338/309
7,042,330 B2 * 5/2006 Nakamura et al. ............ 338/309
7,601,920 B2 * 10/2009 Fujimoto ...................... 174/259
7,782,173 B2 * 8/2010 Urano et al. .................. 338/307
7,786,842 B2 * 8/2010 Tsukada et al. ............... 338/309
2002/0003466 A1 * 1/2002 Yoneda ......................... 338/313
2002/0014949 A1 * 2/2002 Tanaka et al. ................ 338/313

(Continued)

FOREIGN PATENT DOCUMENTS

JP 05304002 A * 11/1993

(Continued)

*Primary Examiner* — Anatoly Vortman
(74) *Attorney, Agent, or Firm* — Stephen Chin

(57) ABSTRACT

The present invention is to provide an electronic component where positional accuracy for arranging members constituting a circuit element such as a resistor element and the like is mitigated and corrosion of a terminal electrode caused by sulfur in the atmosphere is reduced. The four chips connected resistor device 1 as an electronic component comprises: an insulating substrate 2 including a front surface 2*a*, a back surface 2*b* and a side surface 2*c* connecting the front surface 2*a* with the back surface 2*b*; a pair of terminal electrodes placed on the front and back surfaces 2*a* and 2*b* and the side surface 2*c*; a resistor element 5 including a resistor member 4 connected to the pair of terminal electrodes, and a protective layer (a glass film 6 and an overcoating film 7) for protecting the resistor member 4: the auxiliary electrode 9 placed with covering the interface 8 between the overcoating film 7 and the terminal electrode 3; and a nickel plated layer 10 and a solder plated layer 11 placed on the surfaces of the terminal electrode 3 and the auxiliary electrode 9. The interface 8 is placed at the end portion 2*c* of the insulating substrate 2.

18 Claims, 4 Drawing Sheets

U.S. PATENT DOCUMENTS

2002/0140541 A1* 10/2002 Teramae ........................ 338/309
2003/0127706 A1* 7/2003 Tanimura ...................... 257/536
2004/0160303 A1* 8/2004 Kuriyama ..................... 338/309
2004/0164841 A1* 8/2004 Saito et al. .................... 338/309
2004/0262712 A1* 12/2004 Doi ............................... 257/536
2006/0158304 A1* 7/2006 Moriya ........................ 338/22 R
2009/0108986 A1* 4/2009 Urano et al. .................. 338/309

FOREIGN PATENT DOCUMENTS

JP 2004-253467 9/2004
WO WO 2007034874 A1 * 3/2007

* cited by examiner

ELECTRONIC COMPONENT AND MANUFACTURING THE SAME

This application is based on Japanese Patent Application No. 2007-70672 filed on Mar. 19, 2007, the contents of which are hereby incorporated by reference.

BACKGROUND OF THE INVENTION

1. Technical Field

The present invention relates to an electronic component and a method of manufacturing the electronic component.

2. Related Art

A method of barrel plating is generally applied to forming a plated layer such as solder plated layer on a surface of a terminal electrode of an electronic component. In the barrel plating method, many electronic components are put into a basket dipped into a plating solution with metal grains called as dummy balls and plated by oscillating or rotating the basket and applying electricity to it. Even if dummy balls contact an insulating protective layer included in an electronic component, they do not contribute to plating layer formation. Hence, it is difficult to form a plating layer in an area of a terminal electrode close to the interface between a protective layer and a terminal electrode. As a result, a plated layer becomes thinned or unfinished in such area. This means that the area is exposed to the atmosphere, corroding the terminal electrode (a part including Ag in particular) with sulfur in the atmosphere.

In order to restrain such corrosion, JP-A-2004-253467 discloses the technology in that an auxiliary electrode is placed at the interface between a protective layer and a terminal electrode of a resistor element as a chip resistor device on a surface of a substrate where the resistor element is formed. The auxiliary electrode is connected to the terminal electrode.

On the other hand, other members of the resistor element such as a resistor member, a glass film for protecting the resistor member and the like are also placed on the surface of the substrate where the resistor element is formed. Hence, there is difficulty in that many members must be accurately arranged in a extremely narrow area if the auxiliary electrode further is placed at the interface between the protective layer and the terminal electrode.

SUMMARY

An advantage of the present invention is to provide an electronic component where positional accuracy for arranging components constituting a circuit element such as a resistor element is mitigated and corrosion of a terminal electrode caused by sulfur in the atmosphere is reduced.

As a first aspect of the invention, an electronic component comprises; an insulating substrate including a front surface, a back surface and a side surface connecting the front surface with the back surface, a pair of terminal electrodes that are placed in end regions opposed to each other within the insulating substrate and on the front and back surfaces and the side surface; a circuit element including a resistor member and/or a dielectric member connected to the pair of terminal electrodes, being placed on one of surfaces of the insulating substrate; a protective layer protecting the resistor member and/or the dielectric member; an auxiliary electrode being placed, covering the interface between the protective layer and the terminal electrode and connecting the terminal electrode; and an plated layer placed on the surface of the terminal electrode and the auxiliary electrode. The interface between the protective layer and the terminal electrode is placed on the side surface or the back surface of the insulating substrate.

According to the first aspect of the invention, the interface between the protective layer and the terminal electrode is placed on the side surface or the back surface of the insulating substrate. Main members constituting a circuit element are generally placed on one surface of the insulating substrate. Only minor members are placed on the other surface (a back surface) opposing the above one surface and the side surface. In other words, if the interface between the terminal electrode and the protective film is formed on the side surface or the back surface and the auxiliary electrode is placed on the interface, there is little limitation for arranging and placing members. Accordingly, the first aspect of the invention can mitigate positional accuracy for arranging components constituting a circuit element such as a resistor element. Further, the interface is placed in an area where it is uneasy to form the above plated layer, making the terminal electrode easily exposed to the atmosphere. However, the first aspect of the invention blocks the terminal electrode from the atmosphere by placing the auxiliary electrode in the interface. Accordingly, the first aspect of the invention can reduce corrosion of the terminal electrode caused by sulfur in the atmosphere.

In the first aspect of the invention, the thicknesses of the terminal electrode, the protective layer and the auxiliary electrode placed on the side surface may be thinner than the thicknesses of the terminal electrode and the protective layer placed on a front surface of the insulating substrate. The above structure can reduce the dimensional fluctuation of the outer configuration of electronic component at the side surface even if fluctuation of thicknesses of the terminal electrode, the protective electrode and the auxiliary electrode is accumulated when the terminal electrode is placed on the side surface.

In the first aspect of the invention, the auxiliary electrode may be made of a conductive material mainly composed of nickel or nickel alloy. The above structure further avoids corrosion of the auxiliary electrode caused by sulfur in the atmosphere.

In the first aspect of the invention, the auxiliary electrode may be integrally extended from the front surface of the insulating substrate to the side surface of it. This structure can maintain the high adhesiveness of an electronic component with a substrate for mounting the electronic component.

In the first aspect of the invention, the side surface may include a concave portion. This structure can reduce fluctuation of the outer dimension of an electronic component even if the protective layer and the auxiliary electrode are placed on the side surface since members formed within the concave portion do not affect the outer dimension of an electronic component.

According to a second aspect of the invention, a method of manufacturing an electronic component comprises: a) forming a terminal electrode on front and back surfaces of a large insulating substrate and an inner wall of a plurality of through holes, the plurality of through holes being placed on a linearly-partitioned regions, which are horizontally and vertically located and crossed each other on the large insulating substrate, and on lines of the linearly-partitioned regions; b) forming a terminal electrode and a circuit element composed of a resistor member and/or an dielectric member on one surface of a unit of the insulating substrate (called as a unit insulating substrate) that is surrounded by the linearly-partitioned region; c) forming a protective layer on a surface of the circuit element and a conductive member within the inner wall of the through holes so as to protect the circuit element; d) forming an conductive auxiliary electrode so as to cover the interface between the protective layer and the inner wall of the through holes or a part of the conductive member on the back surface of the large insulating substrate; e) partitioning the large insulating substrate into a piece of the unit insulating substrate along the linearly-partitioned region; and f) depositing a low melting point metal film on a surface of the exposed conductive member and a surface of the auxiliary electrode by a method of barrel plating.

According to the second aspect of the invention, the interface between the protective layer and the terminal electrode is placed on the side surface or the back surface of the insulating substrate. Main components constituting a circuit element are generally placed on one surface (a front surface) of the insulating substrate. Only minor components are placed on other surface (a back side surface) opposing the above one surface and the side surface. In other word, if the interface between the terminal electrode and the protective film is formed on the side surface or the back surface and the auxiliary electrode is placed on the interface, there is no limitation for arrangement and placement of components. Accordingly, the second aspect of the invention can mitigate positional accuracy for arranging components constituting a circuit element such as a resistor element. Further, the interface is placed in area where it is uneasy to form the above plated layer, making the terminal electrode easily exposed to the atmosphere. However, the second aspect of the invention blocks the terminal electrode from the atmosphere by placing the auxiliary electrode in the interface. Accordingly, the second aspect of the invention can reduce corrosion of the terminal electrode because of sulfur in the atmosphere. Further, the aspect of the invention can form many circuit elements using a large insulating substrate, efficiently manufacturing electronic components.

In the second aspect of the invention, the terminal electrode, the protective layer, or the auxiliary electrode may be formed by a screen printing method during steps a), c) and d), the terminal electrode, the protective layer, or the auxiliary electrode may be moved into the inner wall of the through holes by sucking air via the through holes from the surface of the large insulating substrate opposing to the printing surface during the screen printing. This method efficiently can form the terminal electrode, the protective layer, or the auxiliary electrode within the inner wall of the through holes in a simple manner.

An advantage of the present invention is to provide an electronic component where positional accuracy for arranging components constituting a circuit element such as a resistor element is mitigated and corrosion of a terminal electrode caused by sulfur in the atmosphere is reduced.

BRIEF DESCRIPTION OF THE DRAWINGS

The invention will be described with reference to the accompanying drawings, wherein like numbers reference like elements.

FIG. 1(A) is a plain view of it. FIG. 1(C) is a partly enlarged view of a left end portion.

DESCRIPTION OF EXEMPLARY EMBODIMENTS

Figure 1:
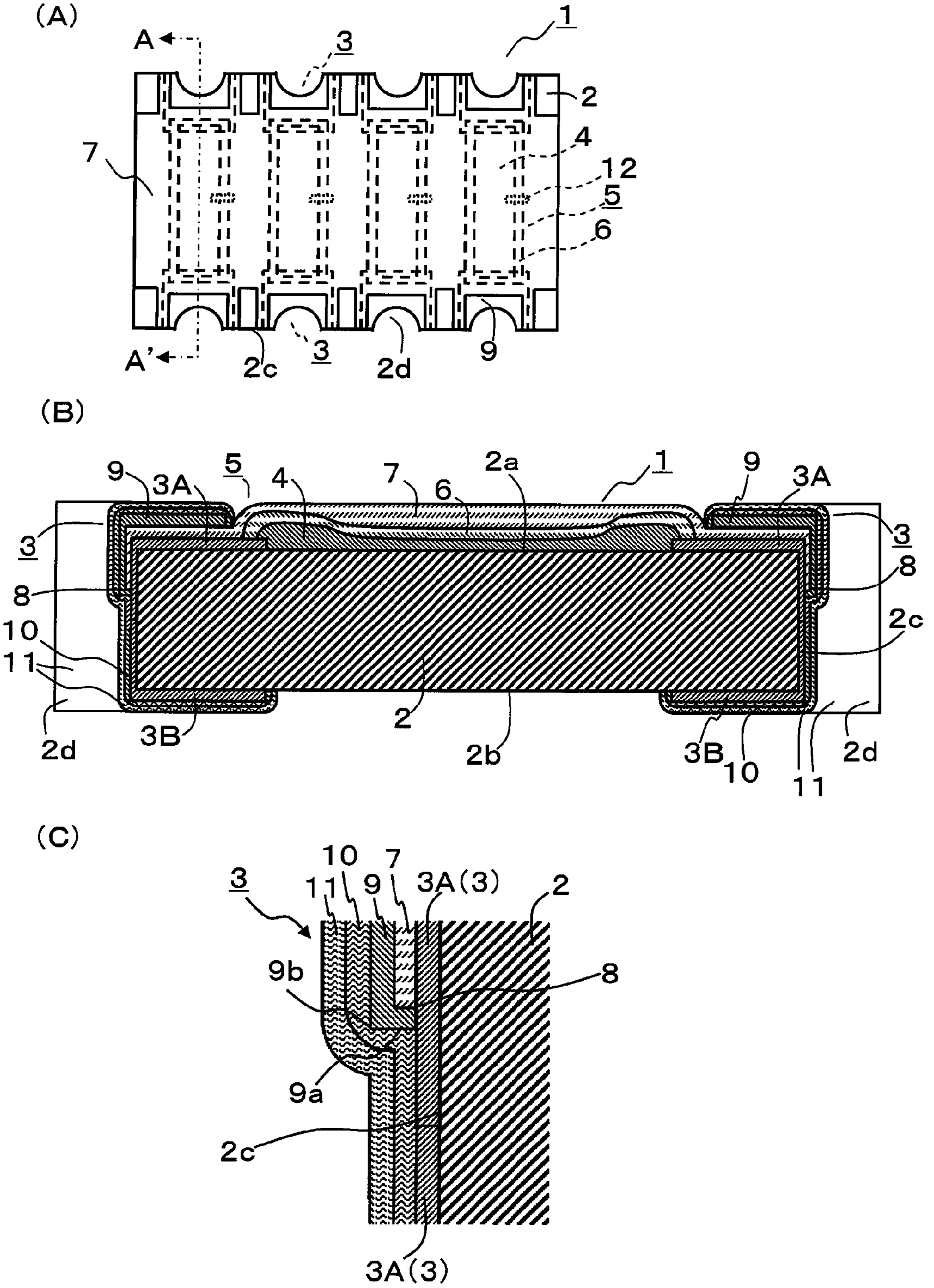
FIGS. 1(A) and 1(C) are a diagram showing four chips connected resistor device in an embodiment of the invention.
FIG. 1(B) is a cross section of A-A' line shown in FIG. 1(A).

Embodiments of the invention will be described.

A resistor device regarding an embodiment of the invention will be explained with referring to drawings.

FIG. 1(A) is a plain diagram showing a four chips connected resistor device 1 in the embodiment of the invention. FIG. 1(B) is a cross section of A-A' line shown in FIG. 1(A). FIG. 1(C) is a partly-enlarged view of a left end portion shown in FIG. 1(B).

The four chips connected resistor device 1 comprises an insulating substrate 2 including a front surface 2*a*, a back surface 2*b* and a side surface 2*c* connecting the front surface 2*a* with the back surface 2*b*. The four chips connected resistor device 1 further comprises four pairs of terminal electrodes 3 and four resistor elements 5. The pairs of terminal electrodes 3 are placed on end regions opposing each other in the insulating substrate 2 and across the front and back surfaces 2*a* and 2*b* and the side surface 2C. The resistor elements 5 include four resistor bodies 4 connected with the pairs of terminal electrodes 3. Further, the device 1 includes a glass film 6 and an overcoating film 7. The glass film is placed at each of four positions as protecting four resistor bodies 4 and the overcoating film 7 integrally covers all glass films 6. The auxiliary electrode 9 is placed as covering an interface region 8 of the overcoating film 7 with a front terminal electrode 3A. The auxiliary electrode 9 is connected to the front surface terminal electrode 3A. The four chips connected resistor device 1 comprises the terminal electrodes 3 including the front surface terminal electrode 3A and the back surface terminal electrodes 3B, a nickel plated layer 10 placed on the surface of the auxiliary electrode and a solder plated layer 11. Then, an interface 8 between the overcoating layer 7 and the front surface terminal electrode 3A is placed on the side surface of the insulating substrate 2.

The thickness of each of the front surface terminal electrode 3A, the overcoating film 7 and the auxiliary electrode 9, placed on the side surface 2*c*, is thinner than the thickness of each of the front surface terminal electrode 3A, and the overcoating film 7, placed on the front surface 2*a* of the insulating substrate 2.

The auxiliary electrode 9 is made of a conductive material mainly composed of nickel or nickel alloy. The auxiliary electrode 9 is integrally formed across the front surface 2*a* and the side surface 2*c* of the insulating substrate 2. The side surface 2*c* includes a concave portion 2*d* having the interface 8.

The detail structure of the four chips connected resistor device 1 will be explained hereafter. As shown in FIGS. 1(A) and 1(B), the four chips connected resistor device 1 includes the insulating substrate 2 like a plate. The insulating substrate 2 includes four pairs of the concave portions 2*d* of which the shape is a half circle. The concave portions 2*d* are placed on the ends of longer sides opposing each other as a pair. The front surface terminal electrode 3A is formed on each of the concave portions 2*d*. The resistor member 4 is placed as overlapping each of the pair of the front surface terminal electrode 3A. The resistor member 4 is a film of which shape is rectangular and its width is narrower than that of the front surface terminal electrode 3A. As the result, four resistor elements 5 are placed on the insulating substrate 2. The glass film 6 covers the entire region of the resistor member 4 as a protecting film. The glass film 6 has a rectangular shape of which an aspect ratio is little larger than that of the resistor member 4. A trimmed groove 12 is formed in the resistor member 4 and the glass film 6 as showing a trace of an arranged resistor value. Further, the overcoating film 7 covers a part of the front surface terminal electrode 3A and all areas of four glass films 6 covering the four resistor films 5 as other protecting film. The overcoating film 7 includes a rectangular shape. The auxiliary electrode 9 constituting the terminal electrode 3 is placed as overlapping the front surface terminal electrode 3A via the overcoating film 7

The structure of the resistor element 5 is explained with referring to FIG. 1(B) as a cross section of the line A-A' in FIG. 1(A). A pair of the front surface terminal electrodes 3A is placed in end regions on the front surface 2*a* of the insulating substrate 2, opposing each other. Each of the front surface terminal electrodes 3A is extended from the end portion of the front surface 2*a* to the central area of the side surface 2C which is about a central region along a path from the front surface 2*a* of the insulating substrate 2 to the back surface 2*b*. Four pairs of the back surface terminal electrodes 3B are arranged in positions which are end regions of the back surface 2*b* of the insulating substrate 2 and opposes to the locations of the front surface terminal electrodes 3A via the insulating substrate 2. The back surface terminal electrodes 3B are extended to the central area of the side surface 2C which is about a central region along a path from the front surface 2*a* of the insulating substrate 2 to the back surface 2*b*. Each of front surface terminal electrodes 3A is connected to each of back surface terminal electrodes 3B around the center of two side surfaces 2*c* opposing each other. As the result, the front surface terminal electrodes 3A and the back surface terminal electrodes 3B are integrally combined to be the terminal electrode 3.

The resistor member 4 is connected to the pair of front surface terminal electrodes 3A since either a part of the resistor member 4 is overlapped with parts of the front surface terminal electrodes 3A. Then, the resistor member 4, the front surface terminal electrodes 3A and the back surface terminal electrodes 3B constitute the resistor element 5. The overcoating film 7 is extended to the central area of the side surface 2*c* which is around a central region along a path from the front surface 2*a* of the insulating substrate 2 to the back surface 2*b*. The overcoating film 7 also exists in an inner area of the trimmed groove 12, which is omitted in the drawing.

The auxiliary electrode 9 is extended from the upper end portion of the overcoating film 7 placed on the front surface 2*a* of the insulating substrate 2 to the interface area 8 between the overcoating film 7 and the front surface terminal electrode 3A. The interface 8 is placed at the end of the overcoating film 7. The overcoating film 7 and the front surface terminal electrode 3A and the back surface terminal electrodes 3B, which are not covered by the overcoating film 7, are covered with the nickel plated layer 10 that is also covered with a solder plated layer 11 as a low melting point metal film.

The structure of the four chips connected resistor device 1 shown in FIG. 1 can mitigate positional accuracy of arranging components for the resistor element 5 and reduce corrosion of the terminal electrode 3 caused by sulfur in the atmosphere. The overcoating film 7 and the auxiliary electrode 9 are placed not only on the front surface 2*a* of the insulating substrate 2, but in an inner surface of the concave portion 2*d* of the side surface 2*c*, mitigating positional accuracy of arranging these components. There is a risk of corrosion of some areas among the terminal electrode 3 in which the thicknesses of nickel plated layer 10 placed on the surface of the terminal electrode 3 and a solder plated layer 11 are thin or unfinished. Such area is normally the interface 8 between the overcoating film 7 and the terminal electrode 3, the front surface terminal electrode 3A in particular in the embodiment. The auxiliary electrode 9 covers the area (the interface 8), blocking the terminal electrode 3 from the atmosphere and reducing corrosion of the terminal electrode 3 caused by sulfur in the atmosphere. The thickness of the plated layer is thin in a region 9*a*, which is a boundary of the overcoating film 7 with the auxiliary electrode 9, in particular, a corner portion 9*b*, making such region easily being contacted with the atmosphere. However, even if the exposed portion of the auxiliary electrode 9 is corroded due to sulfur in the atmosphere, such corrosion does not reach the terminal electrode 3, avoiding the terminal electrode 3 to be cut off. The above structure does not bring any problems when the four chips connected resistor device 1 is used.

Further, the above structure of the four chips connected resistor device 1 shown in FIG. 1 can reduce fluctuation of the outer dimension of a part of the side surface 2*c*, even if thicknesses of the terminal electrode 3 placed on the side surface 2*c*, the overcoating film 7 and the auxiliary electrode 9 are fluctuated and such fluctuation is accumulated. The reason of reducing such fluctuation is the following: Thicknesses of the terminal electrode 3, the overcoating film 7 and the auxiliary electrode 9 that are placed on the side surface 2*c* are thinner than that of the front surface terminal electrode 3A and the overcoating film 7 placed on the front surface of the insulating substrate 2. Such structure hardly affects the outer dimension.

The auxiliary electrode 9 used for the four chips connected resistor device 1 in the embodiment of the invention is preferably made of a conductive material mainly composed of nickel or nickel alloy. The reason is that nickel or nickel alloy is hardly sulfurized compared to silver and the like. The auxiliary electrode 9 used for the four chips connected resistor device 1 in the embodiment of the invention is integrally placed extending from the front surface 2*a* of the insulating substrate 2 to around the center of the side surface 2*c*. Such integrally placing the auxiliary electrode 9 from the front surface 2*a* of the insulating substrate 2 to around the center of the side surface 2*c* can enhance the adhesiveness of the four chips connected resistor device 1 with a substrate for mounting the four chips connected resistor device 1. The reason is that an area for soldering can be enlarged when the four chips connected resistor device 1 is connected to a substrate for mounting the four chips connected resistor device 1 with using a solder. Namely, a solder-attached area is increased by a surface area of the auxiliary electrode 9. Further, integrally placing the auxiliary electrode 9 from the front surface 2*a* of the insulating substrate 2 to around the center of the side surface 2*c* can easily attain bulky supply. In the bulky supply, many of the four chips connected resistor devices 1 are discretely packaged and supplied with making them be aligned toward a predetermined direction. The reason of such easy supply is that the surface flatness of the front surface of the four chips connected resistor device 1 can be improved by aligning the auxiliary electrode 9.

Figure 2:
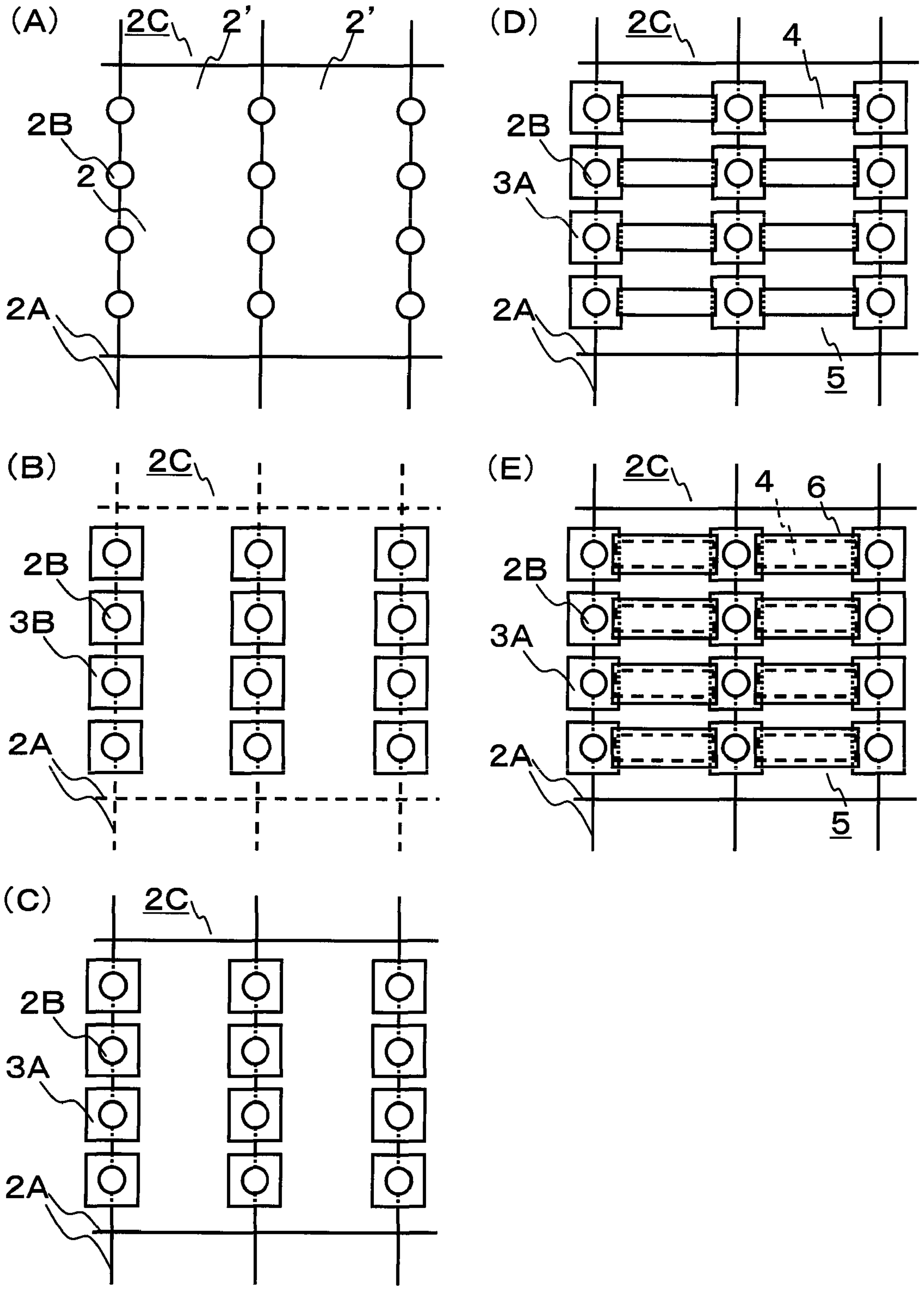
FIGS. 2(A) to (E) are a diagram showing a method of manufacturing the resistor device regarding the embodiment of the invention and ongoing processes from (A) to (E).
Figure 3:
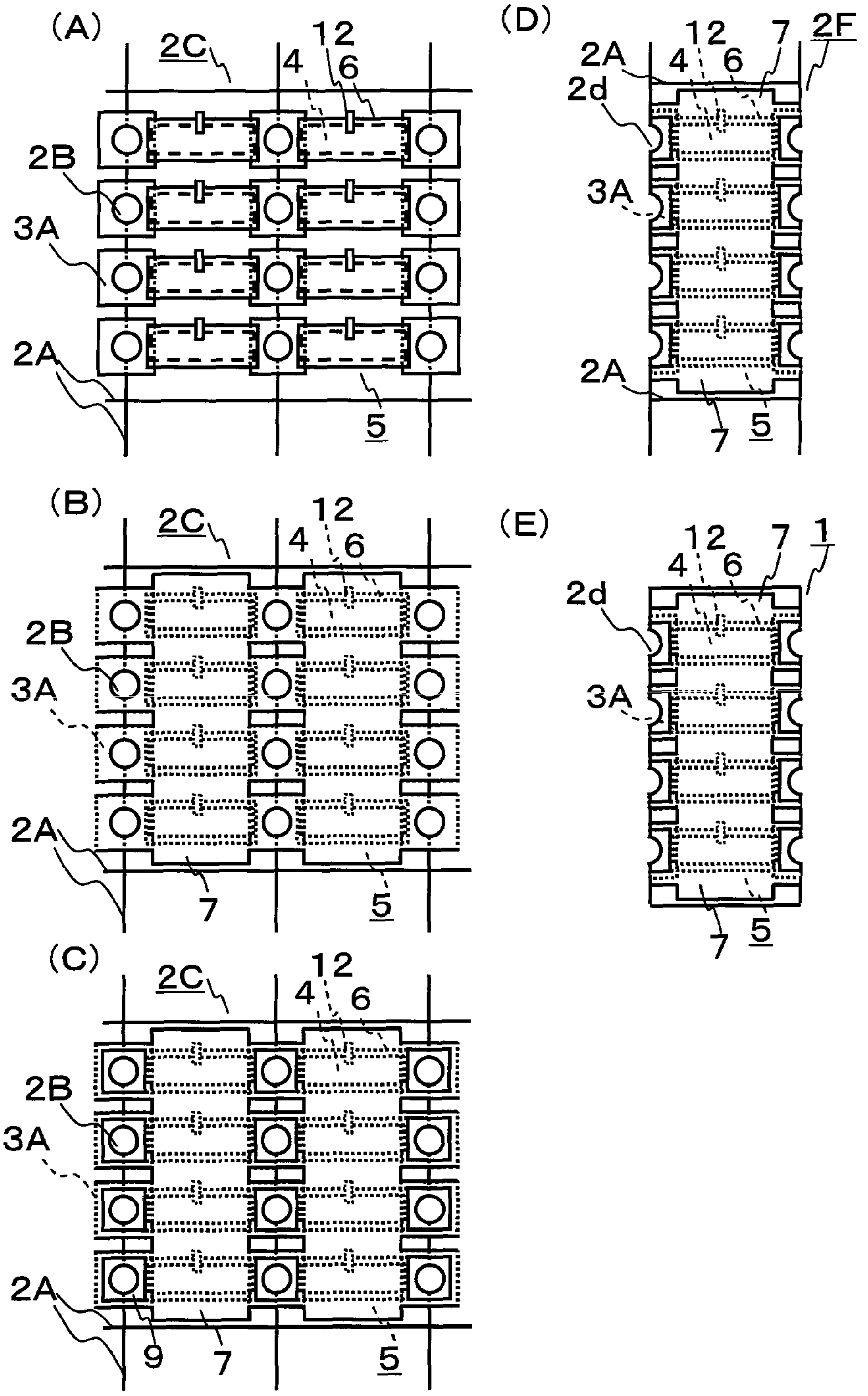
FIGS. 3(A) to (E) are a diagram showing a method of manufacturing the resistor device regarding the embodiment of the invention and ongoing processes from (A) to (E).
Figure 4:
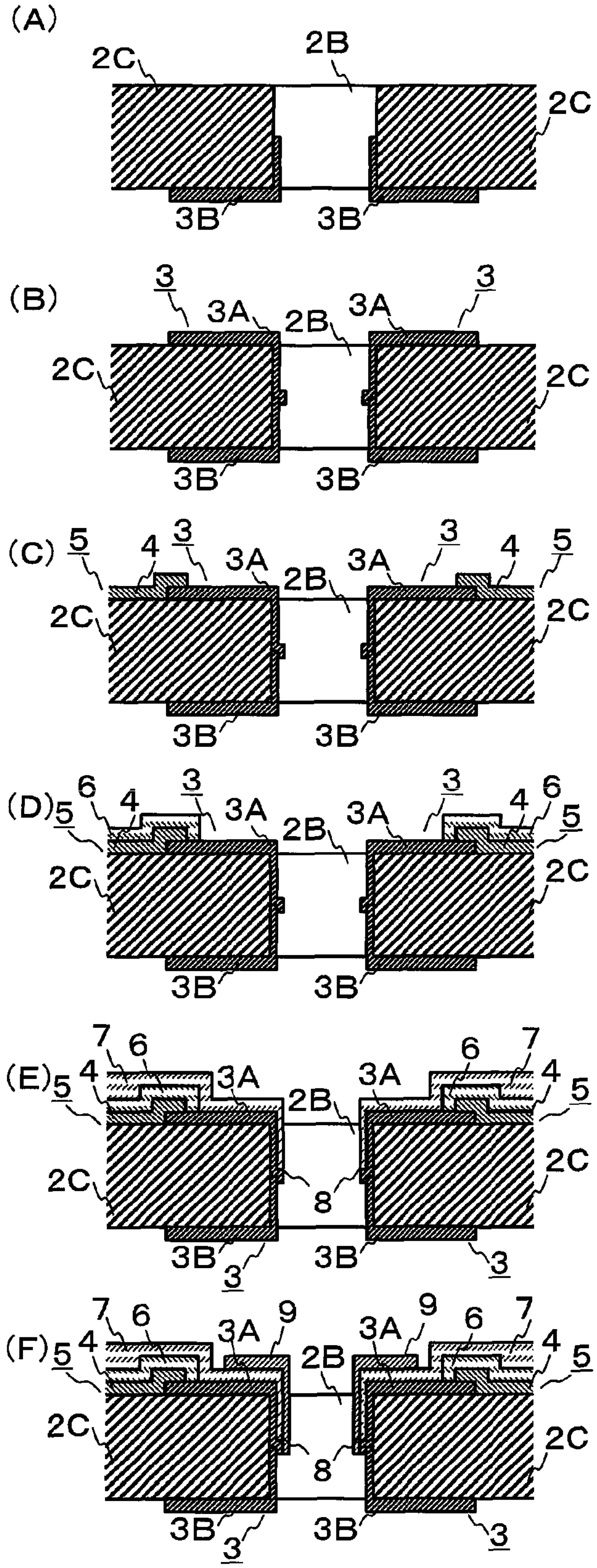
FIGS. 4(A) to (F) are a diagram showing a part of a through hole in every step of the method of manufacturing the resistor device regarding the embodiment of the invention and ongoing steps from (A) to (F).

Further, in the four chips connected resistor device 1 shown in FIG. 1, the terminal electrode 3, the overcoating film 7 and the auxiliary electrode 9 are formed in the concave portion 2*d*. Hence, this structure can further reduce the outer dimension of the four chips connected resistor device 1 since components formed in the inside (an inner wall) of the concave portion 2*d* usually do not affect the outer dimensions A method of manufacturing the four chips connected resistor device 1 regarding the embodiment will be explained with referring to FIGS. 2, 3 and 4. In manufacturing the four chips connected resistor device 1, the large insulating substrate 2C is used. This substrate 2C includes pluralities of through holes 2B on grooves 2A for partitioning horizontally and vertically crossed each other and on lines of the grooves 2A for partitioning. The method of manufacturing the four chips connected resistor device 1 includes at least six processes. First, as a process for forming a terminal electrode, a conductive member is formed in the front and back surfaces of the large insulating substrate 2C and in the inner surface of the through holes 2B. Second, as a process of forming the resistor element, four resistor elements 5 are formed on one surface of an unit insulating substrate 2', which will be the insulating substrate 2 by partitioning the large insulating substrate 2C. Each of these four resistor elements 5 comprises the front surface terminal electrodes 3A, the back surface terminal electrodes 3B and the resistor member 4. Third, as a process of forming the overcoating film 7, the overcoating film 7 is formed on the upper surface of the resistor element 5 and in the inner wall of the through holes 2B. Fourth, as a process of forming the conductive auxiliary electrode, the auxiliary electrode 9 is formed with covering over the interface 8 between the overcoating film 7 and the terminal electrode 3 within the inner surface of the through holes 2B. Fifth, as a process of partitioning, the large insulating substrate 2C is partitioned into pluralities of the unit insulating substrates 2' along the grooves 2A for partitioning after these above processes. Sixth, as a process of plating, the exposed terminal electrode 3 and the surface of the auxiliary electrode 9 are plated by depositing a low melting metal film via a barrel plating method after completing partitioning.

FIG. 2(A) is a plain view of the surface of the large insulating substrate 2C. Grooves 2A for partitioning horizontally and vertically crossed each other are formed on the front surface of the large insulating substrate 2C made of alumina. One unit surrounded by the grooves 2A for partitioning will be the unit insulating substrate 2'. The unit insulating substrate 2 has an almost rectangular shape. The through holes 2B having a circular shape are arranged with an equivalent interval on the long side of the rectangular shape. The details of the above six processes will be explained hereafter.

(Forming Terminal Electrode)

FIG. 2(B) shows the state of forming the back surface terminal electrode 3B surrounding the through holes 2B on the back surface of the large insulating substrate 2C. The back surface terminal electrode 3B is formed by a screen printing method. An opened portion for printmaking used in screen printing has many almost square shapes. During screen printing, air is sucked from the front surface of the large insulating substrate 2C via through each of through holes 2B, called as through-hole printing. Such air intake moves an ink (a metal grace paste of Ag—Pd metal alloy) printed on each of through holes 2B toward the inner wall of the through holes 2B to form a thinner film. The large insulating substrate 2C is burned thereafter. FIG. 4(A) is a cross section showing the current state of an area in the center of the through holes 2B along with a short side of the unit insulating substrate 2'. FIG. 4(B) to FIG. 4(F) are the same cross section shown in FIG. 4(A). As shown in FIG. 4(A), the back surface terminal electrodes 3B are extended to a position at half depth of the inner wall of the through holes 2B. The strength of air suction during through-hole printing can control an ink distribution along the depth of the inner wall of the through hole 2B FIG. 2(B) shows the back surface terminal electrodes 3B formed in the through holes 2B of the unit insulating substrate 2' adjacent each other toward horizontal direction. The similar arrangement is applied to many other unit insulating substrates 2' adjacent each other toward vertical direction or further adjacent each other toward horizontal direction. Such arrangement is also applied to the structure shown in FIGS. 2(C) to 2(E) and FIGS. 3(A) to 3(C).

FIG. 2(C) shows the state of forming the front surface terminal electrodes 3A surrounding the through holes 2B on the front surface of the large insulating substrate 2C. This formation is performed under the same condition of through-hole printing described above. As shown in FIG. 4(B), a part of the front surface terminal electrodes 3A is overlapped with a part of the back surface terminal electrodes 3B, making them electrically connected. As the result, the front surface terminal electrodes 3A and the back surface terminal electrodes 3B are integrally combined to be the terminal electrode 3. FIGS. 1(A) to 1(C) show an example in which a part of the front surface terminal electrodes 3A is not overlapped with a part of the back surface terminal electrodes 3B and ends of them are electrically connected each other. Namely, FIGS. 1(A) to 1(C) show the terminal electrode 3 formed by a method where a part of the front surface terminal electrodes 3A is not overlapped with a part of the back surface terminal electrodes 3B. Here, the protruded portion formed by overlapping may be removed by polishing the inside of the through hole 2B after a part of the front surface terminal electrodes 3A is overlapped with a part of the back surface terminal electrodes 3B as shown in FIG. 4(C). Otherwise, as shown in FIG. 4(C), the state of overlapped parts of electrodes 3A and 3B may be maintained thereafter.

(Forming Resistor Element)

FIG. 2(D) shows a state of forming the resistor member 4 connected to and overlapped with four pairs of front surface terminal electrodes 3A in the unit insulating substrate 2' on the surface of the large insulating substrate 2C. The resistor element is formed by a screen printing using a resistor paste as an ink made of metal powders mainly composed of ruthenium oxide and silver. The large insulating substrate 2C is burned thereafter. Four resistor elements 5 are formed in the unit insulating substrate 2'. FIG. 4(C) shows the current status of these resistor elements.

(Forming Protective Layer and Trimming)

FIG. 2(E) shows a glass film 6 formed by a screen printing with covering over the entire area of the resistor member 4 on the large insulating substrate 2C. FIG. 4(D) shows the current status of the glass film. FIG. 3(A) shows the state of the trimmed resistor element 5 of which a resistor value is adjusted to be a target. In trimming, the position of laser beam irradiation is moved from the surface of the large insulating substrate 2C toward the direction of the glass film 6 and the resistor member 4, evaporating them in order to gradually narrow the current path of the resistor element 5. The resistor value of the resistor element 5 is measured during trimming and laser beam irradiation is stopped if the measured value reaches the target value. As the result of laser beam irradiation, the trimmed groove 12 is formed. The glass film 6 prevents the resistor member 4 from being excessively damaged by laser beam irradiation. The trimming process may be omitted if it is not necessary.

Then, as shown in FIG. 3(B), the overcoating film 7 is formed with covering four resistor elements 5 in the unit insulating substrate 2' on the surface of the large insulating substrate 2C. The overcoating film 7 is formed by a screen printing using an epoxy resin paste as an ink. Then, the large insulating substrate 2C is heated thereafter, hardening the paste. An opened portion for printmaking has a configuration which is capable of supplying an ink to an entire area of four resistor elements in the unit insulating substrate 2' and also capable of supplying an ink to an entire area of the exposed front surface terminal electrode 3A and the through holes 2B. Then, through-hole printing described before is performed. As the result, a part of an ink is distributed into a position of around half depth of the inner wall of the through holes 2B, shown in FIG. 4(E). Then, the interface between the terminal electrode 3 and the overcoating film 7 is formed on the inner wall of the through holes 2B.

(Forming Auxiliary Electrode)

FIG. 3(C) shows the state of forming the auxiliary electrode 9 covering a part of the front surface terminal electrode 3A via the overcoating film 7 on the large insulating substrate 2C. In forming the terminal electrode, a printmaking having a square shaped opened portion is used and positioned at the opened portion for the printmaking used in forming the front surface terminal electrode 3A. The area of this opened portion is little smaller than the opened portion for the printmaking used in forming the front surface terminal electrode 3A. Then, through-hole printing is performed in a similar way of forming the terminal electrode. An ink used in this processing is an epoxy resin paste including nickel powder (a conductive adhesive.) The large insulating substrate 2C is burned thereafter. As shown in FIG. 4(F), in through-hole printing, the strength of air suction is adjusted so as to distribute a part of an ink to the half depth position of the inner wall of the through-holes 2B and cover the interface 8.

(Partitioning)

FIG. 3(D) shows a reed shaped substrate 2F partitioned from the large insulating substrate 2C. The reed shaped substrate 2F is formed by following: The large insulating substrate 2C is folded along the direction of opening a part of the partitioned groove 2A, which is the long side of the unit insulating substrate 2', among the partitioned groove 2A of the large insulating substrate 2C and then, the large insulating substrate 2C is split along the part of the partitioned groove 2A. The reed shaped substrate 2F includes pluralities of the four chips connected resistor devices 1 which are not plated as described later. During the above splitting method, the front surface terminal electrodes 3A, the back surface terminal electrodes 3B, the overcoating film 7 and the auxiliary electrode 9 are also split along the partitioned groove 2A. The through holes 2B become the concave portion 2*d* by being split. A part of splitting process to obtain the reed shaped substrate 2F is called as a first partitioning.

Then, as shown in FIG. 3(E), the four chips connected resistor device 1 which is not plated as described later is obtained by following: The reed shaped substrate 2F is folded along the direction of opening a part of the partitioned groove 2A, which is the short side of the reed shaped substrate 2F, and then, the reed shaped substrate 2F is split along the part of the partitioned groove 2A. The partitioning process of obtaining the four chips connected resistor device 1 which is not plated from the e reed shaped substrate 2F, is called as a second partitioning.

During these first and second partitioning methods, a stress is applied toward the direction of opening the partitioned groove 2A in order to partition the large insulating substrate 2C and the reed shaped substrate 2F. Otherwise, other partitioning such as dicing may be applied instead of the above method. One advantage of dicing is to favorably maintain the dimensional accuracy of partitioning. Other advantage is to give a relatively small impact to the cut area. Further, dicing may be applied to the first partitioning, which is generally difficult to obtain high accuracy of dimensions of the insulating substrate. Then, the method of applying a stress to the direction of opening the partitioned groove 2A, which has an advantage in a manufacturing cost, may be applied to the second partitioning. Further, the partitioned groove 2A may be on other surface of the large insulating substrate 2C opposing to the front surface, or on the both surfaces.

(Plating)

Then, the surfaces of the exposed terminal electrode 3 and the auxiliary electrode 9 are plated by the barrel plating described before. In this plating, first, the nickel plated layer 10 is deposited and, next, the solder plated layer 11 having a low melting metal is deposited. As the result, as shown in FIG. 1 (B), the nickel plated layer 10 and the solder plated layer 11 are finished, completing the four chips connected resistor device 1 regarding the embodiment of the invention.

The four chips connected resistor device 1 and the method of manufacturing the same regarding the embodiments of the invention have been explained in the above. But, various modifications of them can be available within the spirit of the invention. In the above embodiments, the four chips connected resistor device 1 is shown as an electronic component. But, the above embodiments can be applied to other resistor devices such as a chip resistor device having a single piece of the resistor element 5, a chip resistor device having double connected resistor elements, eight connected resistor elements, or sixteen connected resistor elements, or a chip network resistor elements and the like. Further, the above mentioned embodiments can be applied to a circuit element such as a capacitor and coil and a hybrid electronic component in which such circuit element is combined with other element. If an electronic component includes capacitor as a circuit element, the resistor element 4 is replaced with a dielectric member.

Further, in the four chips connected resistor device 1 of the embodiments, the interface 8 between the overcoating film 7 as a protective layer and the terminal electrode 3 is placed at the end portion 2*c* of the insulating substrate 2. But, the interface 8 may be placed on the back surface of the insulating substrate 2. For example, in a case when it is difficult to fine tune the air suction at the time of through-hole printing, or when it is difficult to place the interface 8 at the end portion 2*c* because of a thinner thickness of the substrate 2, it is better that the interface 8 is formed on the back surface 2*b* (on the surface of the back surface terminal electrodes 3B) of the insulating substrate 2.

Further, the four chips connected resistor device 1 of the embodiments includes the concave portion 2*d* and is manufactured using the large insulating substrate 2C including the through holes 2B. But, the concave portion 2*d* and the through holes 2B may be omitted. In such case, an electrode member placed on the end portion 2*c*, the overcoating film 7 and the auxiliary electrode 9 may be formed by a thin film technology such as sputtering or a thick film technology such as coating. Otherwise, in a case when there are the concave portion 2*d* and the through holes 2B, electrode member placed on the end portion 2*c*, the overcoating film 7 and the auxiliary electrode 9 may be formed by a thin film technology such as sputtering or a thick film technology such as coating. If a thick film technology such as coating is applied to the above case, the thicknesses of the terminal electrode 3 placed at the end portion 2*c*, the overcoating film 7 as a protective layer and the auxiliary electrode 9 become equal to or thicker than that of the terminal electrode 3 placed on the front surface 2*a* of the insulating substrate 2. But, such thicknesses do not yield any problems. Despite the above case, the through-hole printing may be further advantageous for forming the concave portion 2*d* and the through holes 2B since films are simply and efficiently formed onto the end portion 2*c* by the through-hole printing.

The auxiliary electrode 9 regarding the four chips connected resistor device 1 of the embodiments is integrally extended from the front surface 2*a* of the insulating substrate 2 to the end portion 2*c*. However, in a case when a thin film technology such as sputtering or a thick film technology such as coating is applied to forming the electrode, the auxiliary electrode 9 is not integrally extended from the front surface 2*a* of the insulating substrate 2 to the end portion 2*c*. But, such formation does not yield any problems. If the sputtering technology is applied, Ni—Cr alloy metal may be used as a material of the auxiliary electrode 9.

Further, the auxiliary electrode 9 is formed with covering a part of the front surface terminal electrodes 3A via the overcoating film 7 in the process of forming the auxiliary electrode regarding the four chips connected resistor device 1 of the embodiments. However, the auxiliary electrode 9 may be formed with covering the entire region of the front surface terminal electrodes 3A. Otherwise, the auxiliary electrode 9 may be formed with covering a part or an entire region of the back surface terminal electrodes 3B by a through-hole printing toward the back surface of the large insulating substrate 2C.

The overcoating film 7 regarding the four chips connected resistor device 1 of the embodiments is made of any of resin materials. But, it may be made of any of glass materials instead of a resin. If it is made of a glass material, selecting a material for the auxiliary electrode 9 can be widened. For example, a material such as a Ag—Pd alloy metal glaze used in forming the front surface terminal electrode 3A and the back surface terminal electrodes 3B can also be used. Such material can be burned at the temperature similar to that for the overcoating film 7. A material such as a metal glaze may include a material deposited by plating.

Further, an ink is moved to the half depth of the through holes 2B during through-hole printing regarding the four chips connected resistor device 1 of the embodiments. But, such depth may be appropriately changed. For example, an ink may be distributed into an entire region of the inner wall of the through holes 2B.

Further, the shape of the through holes 2B regarding the four chips connected resistor device 1 of the embodiments is a circle. But, it may be an eclipse, a rectangular, or changed to any other shapes. But, it is preferably a circle in considering easiness of molding alumina. A material of the insulating substrate 2 may be any other more than alumina such as aluminum nitride and the like.

What is claimed is:

1. An electronic component comprising:

an insulating substrate including a front surface, a back surface and a side surface connecting the front surface with the back surface, a pair of terminal electrodes that are placed in end regions opposed each other within the insulating substrate, and on the front and back surfaces and the side surface;

a circuit element including a resistor member and/or a dielectric member connected to the pair of terminal electrodes, being placed on one surface of the insulating substrate;

a protective layer protecting the resistor member and/or the dielectric member;

an auxiliary electrode being placed with covering the interface between the protective layer and the terminal electrode and connecting the terminal electrode; and a plated layer being placed on the surfaces of the terminal electrode and the auxiliary electrode, wherein the interface between the protective layer and the terminal electrode is placed in one of the side and back surfaces of the insulating substrate.

2. The electronic component according to claim 1, wherein the thicknesses of the terminal electrode, the protective layer and the auxiliary electrode, placed on the side surface, are thinner than the thicknesses of the terminal electrode, the protective layer and the auxiliary electrode, placed on the front surface.

3. The electronic component according to claim 1, wherein the auxiliary electrode is made of a conductive material mainly composed of nickel or nickel alloy.

4. The electronic component according to claim 2, wherein the auxiliary electrode is made of a conductive material mainly composed of nickel or nickel alloy.

5. The electronic component according to claim 1, wherein the auxiliary electrode is integrally extended from the front surface of the insulating substrate to one of the side surface and the back surfaces of the insulating substrate.

6. The electronic component according to claim 2, wherein the auxiliary electrode is integrally extended from the front surface of the insulating substrate to one of the side surface and the back surfaces of the insulating substrate.

7. The electronic component according to claim 3, wherein the auxiliary electrode is integrally extended from the front surface of the insulating substrate to one of the side surface and the back surfaces of the insulating substrate.

8. The electronic component according to claim 4, wherein the auxiliary electrode is integrally extended from the front surface of the insulating substrate to one of the side surface and the back surfaces of the insulating substrate.

9. The electronic component according to claim 1, wherein the side surface includes a concave portion.

10. The electronic component according to claim 2, wherein the side surface includes a concave portion.

11. The electronic component according to claim 3, wherein the side surface includes a concave portion.

12. The electronic component according to claim 4, wherein the side surface includes a concave portion.

13. The electronic component according to claim 5, wherein the side surface includes a concave portion.

14. The electronic component according to claim 6, wherein the side surface includes a concave portion.

15. The electronic component according to claim 7, wherein the side surface includes a concave portion.

16. The electronic component according to claim 8, wherein the side surface includes a concave portion.

17. A method of manufacturing an electronic component comprising:

a) forming a terminal electrode on front and back surfaces of a large insulating substrate and an inner wall of a plurality of through holes, the plurality of through holes being placed on a linearly partitioned regions, which are horizontally and vertically located and crossed each other on the large insulating substrate, and on lines of the linearly-partitioned regions;

b) forming a terminal electrode and a circuit element composed of a resistor member and/or an dielectric member on one surface of a unit of the insulating substrate (called as a unit insulating substrate) that is surrounded by the linearly-partitioned region;

c) forming a protective layer on a surface of the circuit element and a conductive member within the inner wall of the through holes so as to protect the circuit element;

d) forming a conductive auxiliary electrode so as to cover the interface between the protective layer and the inner wall of the through holes or a part of the conductive member on the back surface of the large insulating substrate;

e) partitioning the large insulating substrate into a piece of the unit insulating substrate along the linearly partitioned region; and f) depositing low melting point metal film on a surface of the exposed conductive member and a surface of the auxiliary electrode by a method of barrel plating.

18. The method of manufacturing the electronic component according to claim 17, wherein, during steps a), c) and d), the terminal electrode, the protective layer and the auxiliary electrode are formed by a screen-printing method and air is sucked from a surface opposing to the surface of the large insulating substrate used for printing via the through holes during the screen printing method so as to move the terminal electrode, the protective film and the auxiliary electrode into the inner wall of through holes.

* * * * *